United States Patent
Bouissiere et al.

(10) Patent No.: US 9,943,017 B2
(45) Date of Patent: Apr. 10, 2018

(54) ENCLOSURE DEVICE FOR DISPLAYS

(71) Applicant: Premier Mounts, Fullerton, CA (US)

(72) Inventors: Mike Bouissiere, Yorba Linda, CA (US); Ross Divanfard, Tustin, CA (US)

(73) Assignee: Premier Mounts, Fullerton, CA (US)

( * ) Notice: Subject to any disclaimer, the term of this patent is extended or adjusted under 35 U.S.C. 154(b) by 0 days.

(21) Appl. No.: 15/138,658

(22) Filed: Apr. 26, 2016

(65) Prior Publication Data
US 2016/0324040 A1    Nov. 3, 2016

Related U.S. Application Data

(60) Provisional application No. 62/155,240, filed on Apr. 30, 2015.

(51) Int. Cl.
*H05K 7/20* (2006.01)

(52) U.S. Cl.
CPC ................ *H05K 7/20972* (2013.01)

(58) Field of Classification Search
CPC .. H05K 5/0213; H05K 7/20145; G09F 13/00; G09F 13/22; G09F 2013/222; G09F 7/002; G09F 7/18; G09F 7/20; G09F 2007/1817; G09F 2007/1843; E04H 13/003
USPC ............ 165/287; 361/690–698; 349/58, 161; 40/124.5, 607.01, 773, 765, 772, 780; 706/213; 116/63
See application file for complete search history.

(56) References Cited

U.S. PATENT DOCUMENTS

| 4,129,996 | A | * | 12/1978 | Hardin | ............... F24F 1/027 |
| | | | | | 62/262 |
| 5,832,988 | A | | 11/1998 | Mistry et al. | |
| 6,104,451 | A | * | 8/2000 | Matsuoka | ......... G02F 1/133308 |
| | | | | | 349/58 |
| 6,119,768 | A | | 9/2000 | Dreier et al. | |
| 6,127,663 | A | | 10/2000 | Jones et al. | |
| 6,493,440 | B2 | | 12/2002 | Gromatzky et al. | |
| 6,802,143 | B1 | * | 10/2004 | Rachowitz | ......... G09F 15/0081 |
| | | | | | 40/473 |

(Continued)

FOREIGN PATENT DOCUMENTS

| JP | 2001060787 | 3/2001 |
| KR | 101014560 | 2/2011 |

*Primary Examiner* — Dion R Ferguson
*Assistant Examiner* — Amir Jalali
(74) *Attorney, Agent, or Firm* — Pauly, DeVries Smith & Deffner LLC

(57) ABSTRACT

Embodiments herein include display enclosure devices and related methods. In an embodiment, a display enclosure device enclosing an interior volume is included. The housing can include a front panel defining an aperture. The display enclosure device can also include a translucent pane of material occluding the aperture in the front panel and an air intake vent disposed on the housing adjacent the bottom of the housing. The display enclosure device can also include a first fan in fluid communication with the air intake vent to move air from the air intake vent, through the filter, and into the enclosed interior volume. The display enclosure device can also include an air exhaust turret disposed on top of the housing. The air exhaust turret can include an air exhaust vent to convey air from inside the air exhaust turret to the exterior environment. Other embodiments are also included herein.

29 Claims, 8 Drawing Sheets

(56) References Cited

U.S. PATENT DOCUMENTS

| | | | | |
|---|---|---|---|---|
| 7,995,342 B2* | 8/2011 | Nakamichi | G02F 1/133308 | 361/695 |
| 8,208,091 B2* | 6/2012 | Juan | G02F 1/133308 | 349/58 |
| 8,223,311 B2* | 7/2012 | Kim | G02F 1/133385 | 349/161 |
| RE45,117 E * | 9/2014 | Kang | G02F 1/133308 | 313/582 |
| 8,857,828 B1* | 10/2014 | San Clemente | B62B 5/0013 | 248/918 |
| 8,922,033 B2* | 12/2014 | Vallinayagam | H02K 9/02 | 290/1 B |
| 9,075,262 B2* | 7/2015 | Cho | G02F 1/133385 | |
| 9,380,719 B2* | 6/2016 | Onda | G06F 1/16 | |
| 2002/0089824 A1* | 7/2002 | Nakano | H05K 7/20181 | 361/695 |
| 2004/0245420 A1* | 12/2004 | Pfister | F16C 11/103 | 248/289.11 |
| 2005/0110911 A1* | 5/2005 | Childrey | F16M 11/10 | 348/794 |
| 2007/0030405 A1* | 2/2007 | Childrey | F16M 11/10 | 348/794 |
| 2010/0128433 A1* | 5/2010 | Harwood | H05K 7/20545 | 361/690 |
| 2011/0075361 A1* | 3/2011 | Nakamichi | G09F 9/35 | 361/695 |
| 2011/0116231 A1* | 5/2011 | Dunn | H04N 5/64 | 361/695 |
| 2011/0162831 A1* | 7/2011 | Lee | H05K 7/20972 | 165/287 |
| 2011/0303244 A1* | 12/2011 | Faragher | A47L 9/183 | 134/21 |
| 2012/0255721 A1* | 10/2012 | Kim | G02F 1/133382 | 165/288 |
| 2012/0293941 A1* | 11/2012 | Myerchin | F16M 11/046 | 361/679.22 |
| 2013/0087320 A1* | 4/2013 | James | H05K 7/20572 | 165/253 |
| 2015/0250067 A1* | 9/2015 | Gaddam | H05K 5/0213 | 40/541 |
| 2015/0257310 A1* | 9/2015 | DeSouza | H05K 7/20836 | 361/679.46 |
| 2015/0276249 A1* | 10/2015 | Rasmussen | F24F 11/0001 | 454/251 |

* cited by examiner

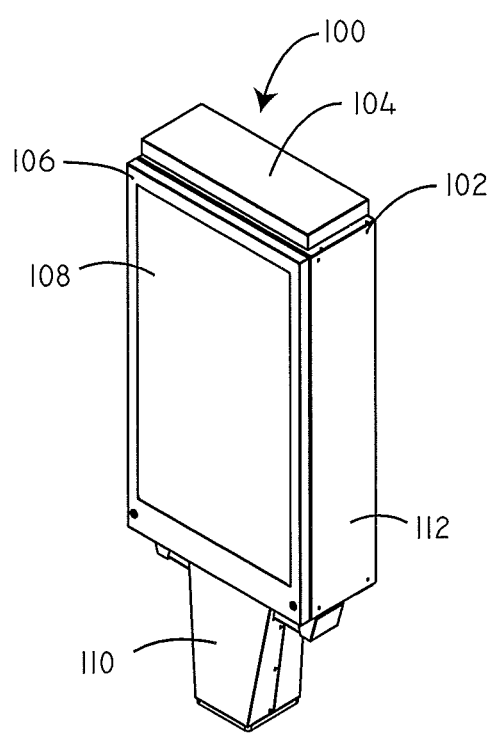
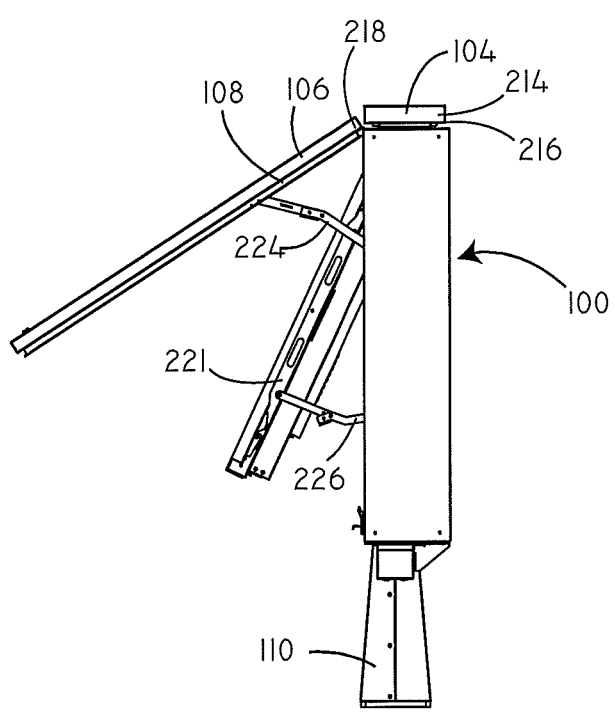
FIG. 1
FIG. 2

ENCLOSURE DEVICE FOR DISPLAYS

This application claims the benefit of U.S. Provisional Application No. 62/155,240 filed Apr. 30, 2015, the contents of which are herein incorporated by reference.

FIELD

Embodiments herein relate to display enclosure devices and methods regarding the same.

BACKGROUND

The use of outdoor advertising is commonplace in modern society. The vast majority of such outdoor advertising is accomplished by way of printed materials, billboards, and painted signs. Such materials are relatively inexpensive and can stand up to a variety of temperatures and weather conditions.

However, such traditional outdoor advertising materials are usually limited to static content display. Modern technology now allows for content to be displayed on display monitors (such as LED/LCD displays) in an active manner allowing for content change and real-time updating. However, such modern display monitors are typically highly sensitive to varying temperature and weather conditions. In addition such modern display monitors generate heat that in many cases must be dissipated.

SUMMARY

Embodiments herein include display enclosure devices and related methods. In an embodiment, a display enclosure device is included. The display enclosure device can include a housing enclosing an interior volume. The housing can include a front panel, the front panel defining an aperture. The display enclosure device can also include a translucent pane of material (such as a polymer, glass, protective glass, touch glass, or the like) occluding the aperture in the front panel and an air intake vent disposed on the housing adjacent the bottom of the housing. The display enclosure device can also include a first fan in fluid communication with the air intake vent to move air from the air intake vent, through the filter, and into the enclosed interior volume. The display enclosure device can also include an air exhaust turret disposed on top of the housing and in fluid communication with the interior volume of the housing. The air exhaust turret can include an air exhaust vent to convey air from inside the air exhaust turret to the exterior environment.

This summary is an overview of some of the teachings of the present application and is not intended to be an exclusive or exhaustive treatment of the present subject matter. Further details are found in the detailed description and appended claims. Other aspects will be apparent to persons skilled in the art upon reading and understanding the following detailed description and viewing the drawings that form a part thereof, each of which is not to be taken in a limiting sense. The scope herein is defined by the appended claims and their legal equivalents.

BRIEF DESCRIPTION OF THE FIGURES

Aspects may be more completely understood in connection with the following drawings, in which:

FIG. 1 is a schematic perspective view of a display enclosure device in accordance with various embodiments herein.

FIG. 2. is a schematic side view of a display enclosure device in an opened configuration in accordance with various embodiments herein.

Figure 3:
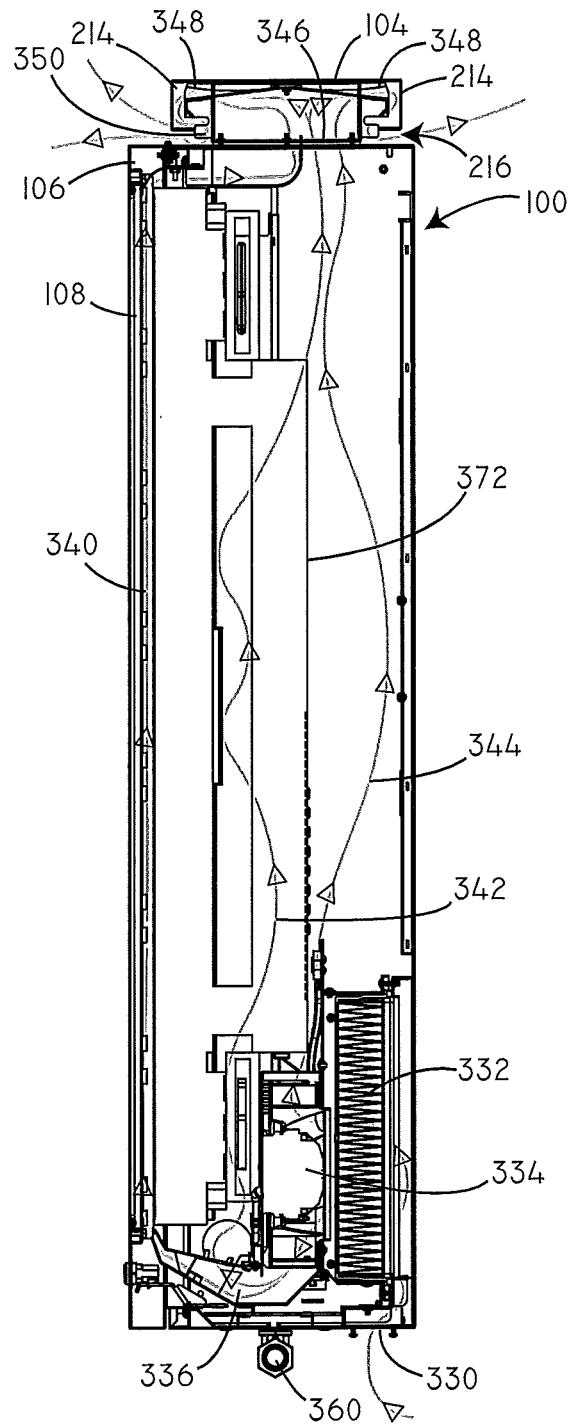
FIG. 3 is a schematic cross sectional view of a display enclosure device showing air flow paths consistent with various embodiments herein.

While embodiments are susceptible to various modifications and alternative forms, specifics thereof have been shown by way of example and drawings, and will be described in detail. It should be understood, however, that the scope herein is not limited to the particular embodiments described. On the contrary, the intention is to cover modifications, equivalents, and alternatives falling within the spirit and scope herein.

DETAILED DESCRIPTION

The embodiments described herein are not intended to be exhaustive or to limit the invention to the precise forms disclosed in the following detailed description. Rather, the embodiments are chosen and described so that others skilled in the art can appreciate and understand the principles and practices.

All publications and patents mentioned herein are hereby incorporated by reference. The publications and patents disclosed herein are provided solely for their disclosure. Nothing herein is to be construed as an admission that the inventors are not entitled to antedate any publication and/or patent, including any publication and/or patent cited herein.

Referring now to FIG. 1, a display enclosure device 100 is shown including a housing 102. The housing 102 includes a front panel 106. The housing 102 defines an interior volume (not shown in this view). The front panel 106 defines an aperture into which a translucent pane of material 108 is disposed. The translucent pane of material 108 occludes the aperture in the front panel 106. The translucent pane of material can be formed from glass (including, but not limited to, regular glass, protective glass, glass with touch film, etc.), plastic or the like and can be of a thickness determined by the optics of the display unit.

The housing 102 also includes a side panel 112. In some embodiments, the housing further comprises a back panel opposite the front panel, a first side panel, a second side panel opposite the first side panel, a top panel having a water-tight top surface and a bottom panel. In some embodiments, the distance between the front panel and the back panel is less than half of the distance between the first side panel and the second side panel. However, in other embodiments, the distance between the front panel and the back panel may be greater. For example, in some embodiments, the distance between the front panel and the back panel may be about equal to the distance between the first side panel and the second side panel.

The panels of the housing 102 can be made of various materials including, but not limited to, polymers, composites, metals, coated metals and the like. The display enclosure device 100 also includes a base 110. An interlinked assembly of steel thin plates within the housing can be attached to a main railing to create a holding bracket that can secure and swivel the display monitor.

An air exhaust turret 104 is disposed on top of the housing 102 and is in fluid communication with the interior volume of the housing 102. The air exhaust turret 104 can have multiple sides. An air exhaust vent can allow air to flow out of the air exhaust turret on more than one side. In some embodiments, the turret 104 can be rectangular. However, the turret 104 can also be other shapes including, but not limited to, polygonal, square, non-polygonal, oval, circular, and the like.

Referring now to FIG. 2, a schematic side view of a display enclosure device 100 in an opened configuration is shown in accordance with various embodiments. The front panel 106 can be coupled to the top of the housing 102 through the use of a hinge 218. The front panel 106 and the translucent pane of material 108 can swing outward from the bottom portion of the housing 102. The front panel 106 can also be coupled to the display enclosure device 100 with a front panel folding support arm 224. The display disclosure device 100 can also include a monitor support frame 221 (which can form part or all of the support bracket), which can also swing outward from the bottom portion of the housing 102. The monitor support frame 221 can be coupled (directly or indirectly) to a display monitor using screws, bolts, pins, or the like. The monitor support frame 221 can be coupled to the display enclosure device 100 through a hinge near the top of the housing 102 and a monitor folding support arm 226. In some embodiments the hinge can be a hook and pin type hinge, but in other embodiments could also be another type of hinge.

The air exhaust turret 104 can include an overhanging edge portion 214, the overhanging edge portion 214 can be separated from the top surface of the housing by an air gap 216. The air exhaust turret 104 can include a waterproof top surface, in some cases formed from a coated metal.

The display monitor unit can be a light-emitting diode (LED) flat panel electronic monitor, an organic light-emitting diode (OLED), a liquid crystal (LCD) flat panel electronic monitor, or other type of flat or curved panel monitor, and such monitor unit can be of various dimensions.

The display monitor unit can be mounted with a support bracket that can allow for an air gap between the inner side of the transparent pane of material and the display unit outer surface. The monitor support bracket can be disposed within the housing; the support bracket can include several long articulated sections to hold a display monitor. The support bracket configured to swivel the bottom portion of the display monitor outward. In addition, other airflow paths can be included within the housing to provide for a flow of cooling air.

Referring now to FIG. 3, a schematic cross sectional view is shown of a display enclosure device showing air flow paths consistent with various embodiments herein. Air can enter the display enclosure device 100 through an air intake vent 330. In some embodiments the air intake vent 330 can be fitted with a small gage mesh to prevent insects from entering the enclosure. In some embodiments, the air intake vent 330 can be fitted with power-actuated (such as solenoid-driven) louvers to allow the vent to be shut. Air coming from the air intake vent 330 can then pass through a filter 332 before passing onto a fan 334 (or blower). The filter 332 can include a filter medium to remove particulate material from air passing the filter 332. The filter medium can include various different materials and constructions. In some embodiments, the filter medium can be a reticulated cellulose material.

The fan 334 can provide the force required to move air along the airflow paths within the housing 102. The fan 334 can move air into a redirection baffle 336 (or distribution manifold) which can direct a volume of air toward the front of the housing 102 leading into a first airflow path as well as a volume of air upward along one or more other airflow paths.

An air gap between the inner side of the transparent pane of material 108 and the display unit outer surface can form a first air flow path 340. The gap can be of various sizes. In some embodiments the gap can be from 0.25 to 0.75 inches. This gap allows for cool air to flow along the first air flow path 340 from the bottom or lower channel inlet to the top to cool the monitor display surface to the manufacturer's recommended monitor requirements.

A second airflow path 342 can be defined through the middle of the housing 102. In some embodiments, a third airflow path 344 can also be defined through the housing 102 adjacent the back of the housing 102. The third airflow path 344 can pass behind an interior support wall 372 that, itself, can include apertures to provide for the passage of air.

An aperture 346 in the top of the housing 102 can provide for a path for air to move from the enclosed interior of the housing 102 into the turret 104. The air exhaust turret 104 can include an air exhaust vent 350 to convey air from inside the air exhaust turret 104 to the exterior environment. The air exhaust turret 104 can include an airflow valve 348 in fluid communication with the air exhaust vent 350. The airflow valve 348 can be configured to open when the air pressure inside the air exhaust turret 104 exceeds the air pressure in the exterior environment. The direction of airflow through the air exhaust turret 104 can change from upward (such as when it first enters the turret 104) to downward (such as when the air exits the air exhaust vent 350).

A connection conduit port 360 can be disposed on the bottom of the housing 102 to create a secure means of passing cables such as power or communication cables into the housing 102.

Figure 4A:
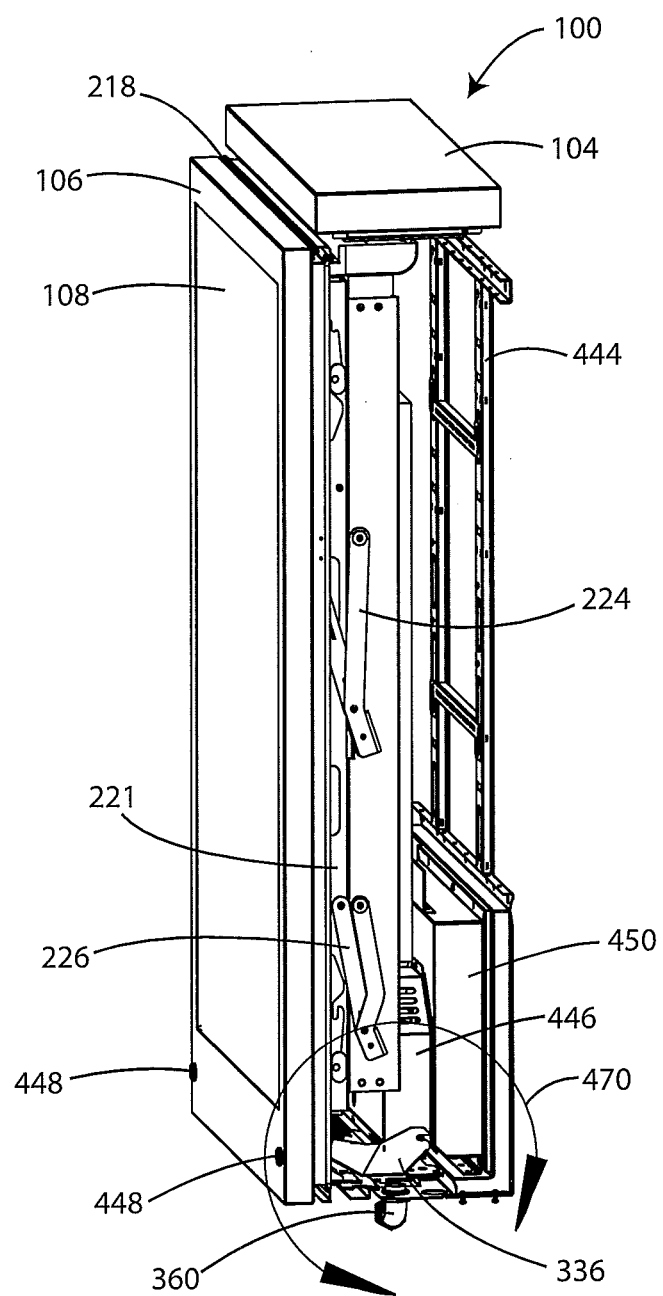
FIG. 4A is a schematic perspective cutaway view of a display enclosure device in accordance with various embodiments herein.

Referring now to FIG. 4A, a schematic perspective cutaway view is shown of a display enclosure device 100 in accordance with various embodiments herein. The display enclosure device 100 can include an internal frame 444. A filter box 450 can be disposed within the display enclosure device 100 to hold the filter. In addition, a fan housing 446 (or fan cage) can be disposed within the display enclosure device to hold the fan (or blower). Locking mechanisms 448 can be included, such as on the bottom of the front panel 106 in order to secure the front panel 106 in a closed position.

Figure 4B:
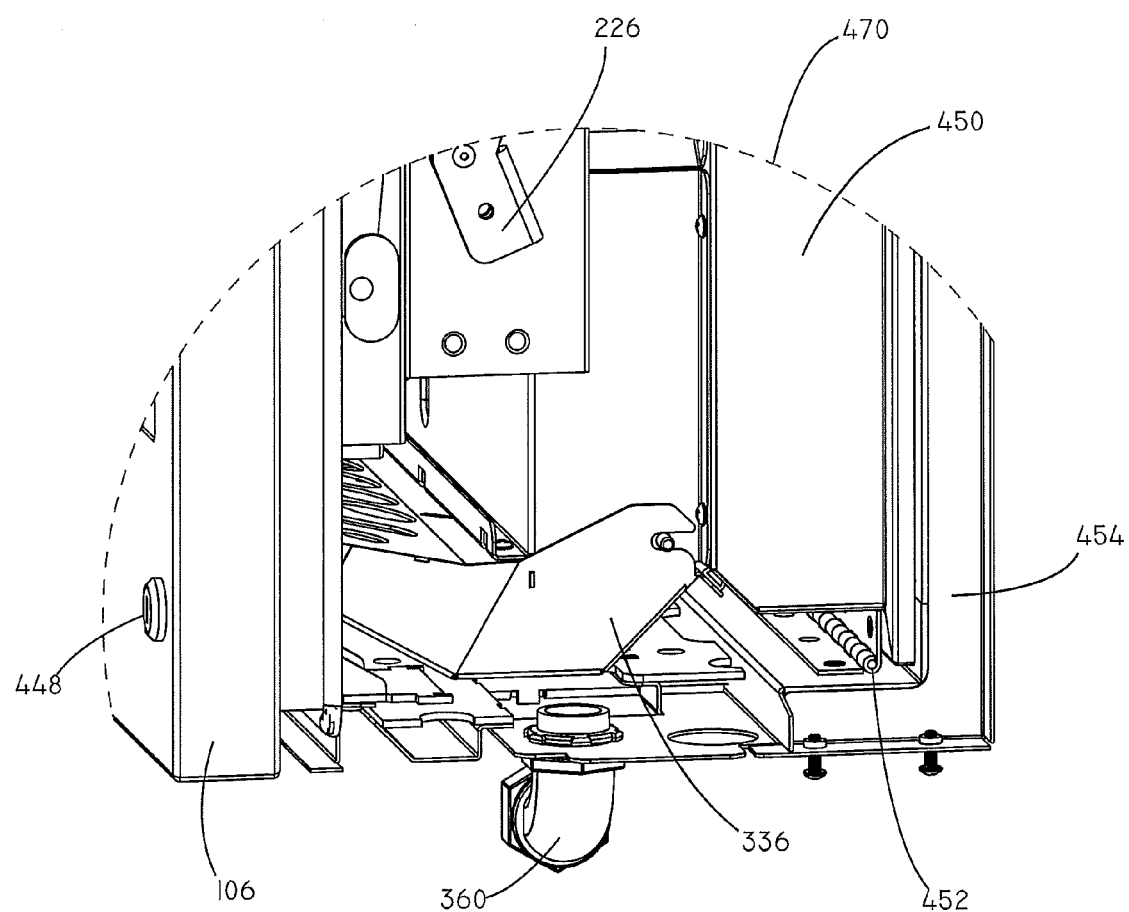
FIG. 4B is a schematic perspective cutaway view showing an enlarged portion of the display enclosure device of FIG. 4A.
Figure 5:
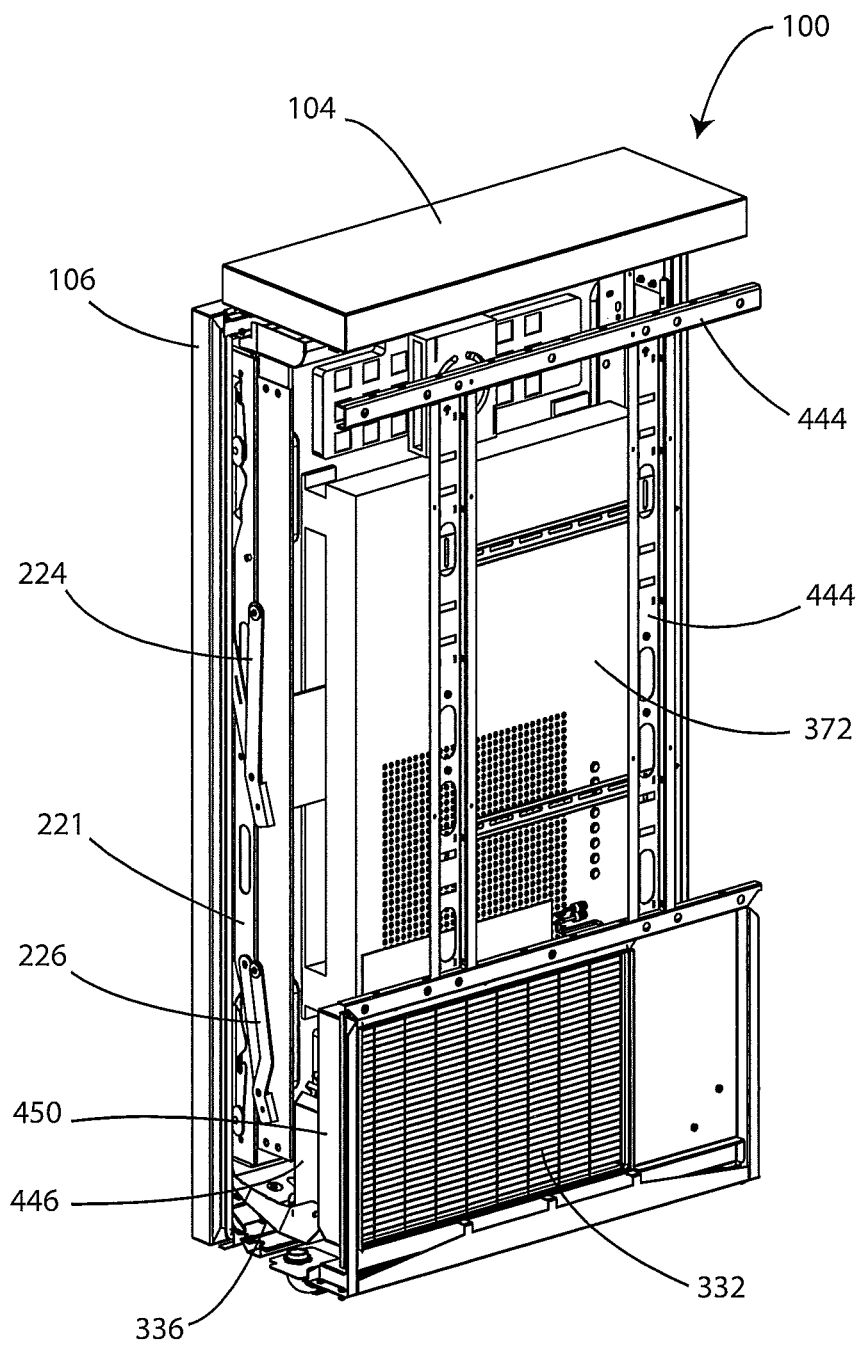
FIG. 5 is a schematic rear perspective cutaway view of a display enclosure device in accordance with various embodiments herein.

Referring now to FIG. 4B is a schematic perspective cutaway view showing an enlarged portion 470 of the display enclosure device of FIG. 4A. In this view, a hinge 452 can be seen which can enable a panel on the filter box 450 to be opened in order to access the filter therein. In this view, the inflow channel 454 can be seen which guides the flow of air after entering through the air intake vent 330 and before passing through the filter. Referring now to FIG. 5, a schematic rear perspective cutaway view of a display enclosure device in accordance with various embodiments herein.

Figure 6:
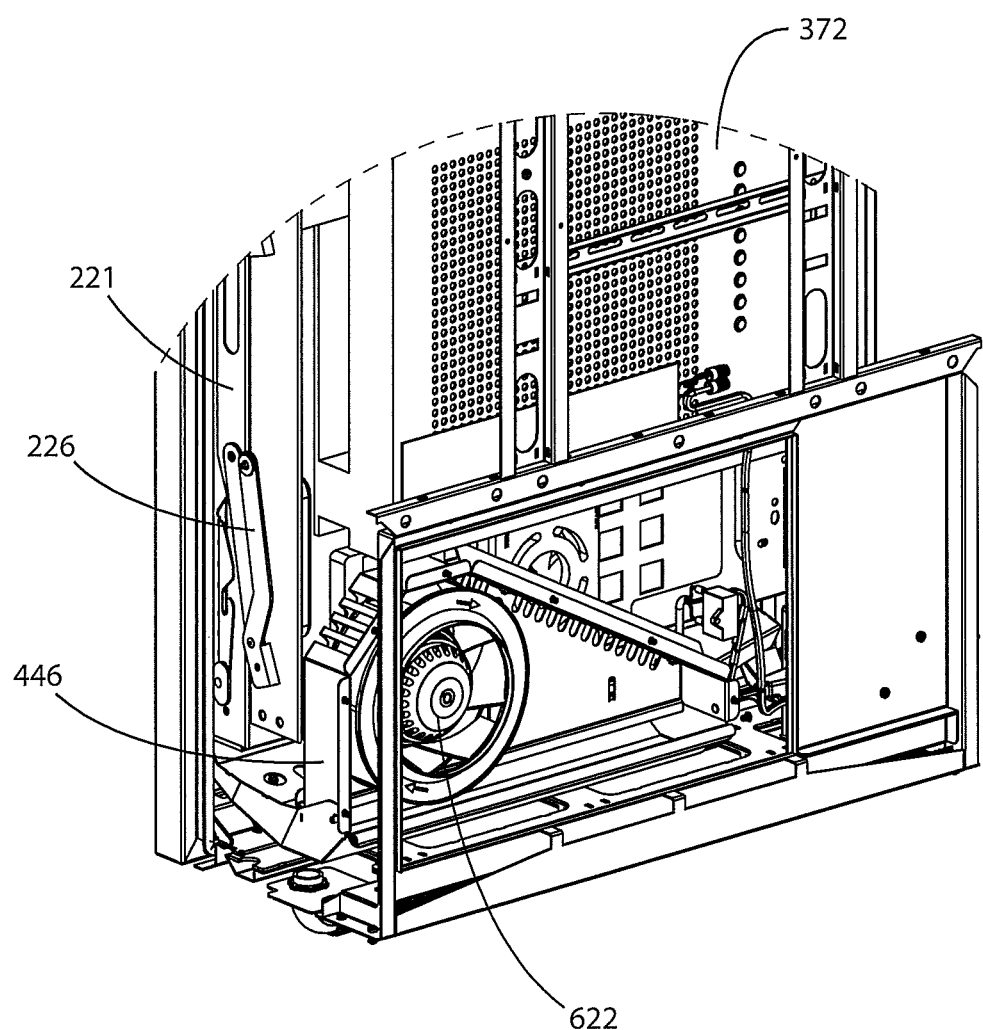
FIG. 6 is a partial schematic rear perspective cutaway view of a display enclosure device in accordance with various embodiments herein.

Referring now to FIG. 6, a partial schematic rear perspective cutaway view of a display enclosure device in accordance with various embodiments herein is shown. In this view, the fan 622 (or blower) can be seen as disposed within the fan housing 446.

Figure 7:
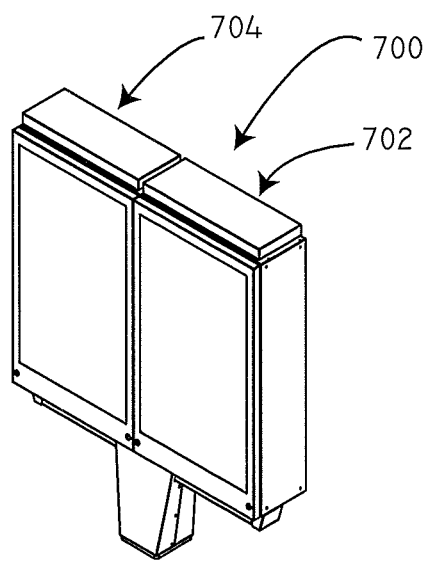
FIG. 7 is a schematic front perspective view of a modular display enclosure device in accordance with various embodiments herein.
Figure 8:
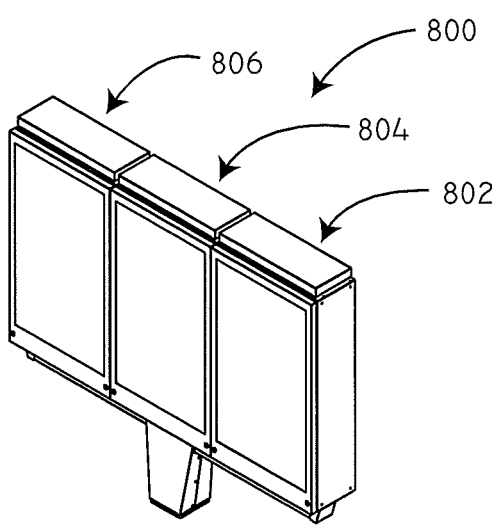
FIG. 8 is a schematic front perspective view of a modular display enclosure device in accordance with various embodiments herein.

In will be appreciated that in some embodiments that display enclosure devices 100 can be configured as modular units and combined in order to provide for the protection and cooling of multiple displays. For example, referring now to FIG. 7, a schematic front perspective view of a modular display enclosure device 700 in accordance with various embodiments herein is shown. The modular display enclosure device 700 includes a first unit 702 and a second unit 704. Each of the units can include features as described above. In some embodiments three or more units can be combined. Referring now to FIG. 8, a schematic front perspective view of a modular display enclosure device 800 in accordance with various embodiments herein is shown. The modular display enclosure device 800 includes a first unit 802 a second unit 804 and a third unit 806.

Figure 9:
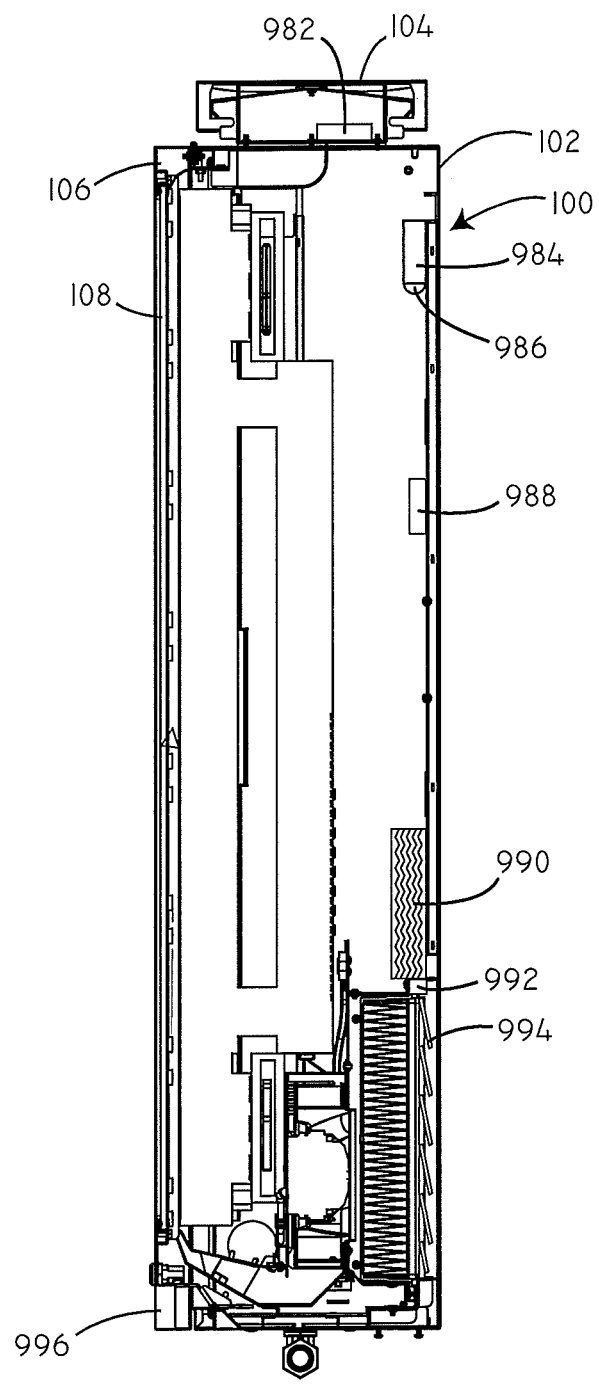
FIG. 9 is a schematic cross sectional view of a display enclosure device showing other components consistent with various embodiments herein.

It will be appreciated that embodiments herein can also include other components. Referring now to FIG. 9, a schematic cross sectional view is shown of a display enclosure device having other components consistent with various embodiments herein. The display enclosure device 100 can include an exhaust fan 982 mounted in the turret 104. It will be appreciated that in some embodiments the exhaust fan 982 can also be mounted within the housing 102. In some embodiments, the display enclosure device 100 can also include a control unit 984. The control unit 984 can include programmable circuitry for operating various elements of the device 100 such as, when present, fans, louvers, and/or valves therein and can also include communication circuitry for wired or wireless communication to and from external sources. The control unit 984 can be configured to maintain the internal temperature within the display enclosure device 100 within a preset range. In some embodiments, the control unit 984 can be configured to maintain the internal temperature within the display enclosure device 100 below 50 degrees Celsius. The control unit 984 can also be configured to maintain a positive pressure within the display enclosure device 100.

In some embodiments the display enclosure device 100 can also include a temperature sensor 986. The control unit 984 can be in electronic communication with the temperature sensor 986. In some embodiments, the control unit 984 can initiate movement of one or more fans when the temperature sensor 986 indicates that the temperature has risen above a threshold temperature. In some embodiments, the control unit 984 can set the speed of the fan proportionately to the difference between a threshold temperature and the current temperature indicated by the temperature sensor 986.

The temperature sensor 986 can be of various types including, but not limited to, a thermistor based temperature sensor. In some embodiments, more than one temperature sensor 986 can be included. In some embodiments the display enclosure device 100 can also include a recirculation fan 988.

In some embodiments the display enclosure device 100 can also include an electric heating element 990. The electric heating element 990 can be of various wattages. In circumstances where ambient temperatures are low, the electric heating element 990 can be used to raise the temperature inside of the display enclosure device 100. By way of example, the electric heating element 990 can be controlled via a thermostat and/or a control unit 984. In some embodiments, the control unit 984 can turn on the electric heating element when the temperature sensor 986 indicates that the temperature has fallen below a threshold temperature. In some embodiments, a fan, such as recirculation fan 988 or a fan integrated with the electric heating element can be used when the electric heating element 990 is turned on. In some embodiments, the electric heating element 990 may be positioned near the bottom of display enclosure device 100 in order to provide for a chimney-type heating effect.

In some embodiments the display enclosure device 100 can also include louvers 994. The louvers 994 can be used to shut off the path of incoming air into the display enclosure device 100. The louvers 994 can be manipulated using an actuation device 992, such as a solenoid, servo, stepper motor, or the like. In some embodiments the display enclosure device 100 can also include a media player 996, such as to provide for sound.

It will be appreciated that various methods are also included herein. In some embodiments, a method of operating a display enclosure device is included. The operation of the display enclosure device for summer operation includes causing outside air at ambient temperature and relative humidity to enter the enclosure through the bottom vent. The air flows through an air filter that can trap most airborne particulates and repel water.

After flowing through the filter, the air can pass through a high capacity fan or air blower or axial fan. This fan has enough capacity to overcome the flow impedance from the vent to after the blower. In some embodiments, the fan can produce airflow of at least about 100 CFM, 150 CFM, 200 CFM, 250 CFM, 300 CFM, 350 CFM, 375 CFM, 400 CFM, 425 CFM, or 450 CFM. The power consumption of the fan will vary based on the specific load, however, in some embodiments the fan can consume from about 10 to about 200 Watts or in some embodiments from about 30 to about 100 Watts. The display enclosure device can effectively dissipate heat in order to accommodate relatively large amounts of total usage from components housed therein such as the display monitor, media equipment (such as audio equipment), fans, control units, etc. In some embodiments, the display enclosure device can dissipate enough heat to have components with a rated heat dissipation of 350 Watts, 400 Watts, 450 Watts, 500 Watts, 550 Watts, 600 Watts, 650 Watts, 700 Watts, 750 Watts, 800 Watts, 850 Watts, 900 Watts, or more, contained therein (per modular unit, such that system with greater numbers of units would have correspondingly larger capability for heat dissipation). In various embodiments, the display enclosure device 100 can accommodate such wattages, as well as the solar load on the outside surfaces of the display enclosure device, while maintaining the internal temperature at or below 50 degrees Celsius.

The fan or blower can be bolted or attached to a fan housing or flow cage to limit vibration and enhance flow generation. After the fan, the cooling air can conveyed by a redirection baffle, or canal or channel that directs air through an air gap between the monitor's display surface and the transparent/translucent material pane associated with the front panel. The flow continues until it reaches the entrance of the exhaust turret and leaves through an all around gap. The air exhaust process may be enhanced by the addition of an exhaust fan in the turret. In some embodiments, a recirculation fan can also be included within the housing. Some of the air brought in by the main blower flows upwards from its cage and behind the monitor mounted therein. This secondary air flow can cool the back of the monitor and other electronic equipment that is installed in the enclosure. The secondary flow continues until it reaches the entrance of the exhaust turret and leaves through an all around gap. The air exhaust process may be added by the addition of an exhaust fan in the turret.

It should be noted that, as used in this specification and the appended claims, the singular forms "a," "an," and "the" include plural referents unless the content clearly dictates otherwise. Thus, for example, reference to a composition containing "a compound" includes a mixture of two or more compounds. It should also be noted that the term "or" is generally employed in its sense including "and/or" unless the content clearly dictates otherwise.

It should also be noted that, as used in this specification and the appended claims, the phrase "configured" describes a system, apparatus, or other structure that is constructed or configured to perform a particular task or adopt a particular configuration to. The phrase "configured" can be used interchangeably with other similar phrases such as arranged and configured, constructed and arranged, constructed, manufactured and arranged, and the like.

All publications and patent applications in this specification are indicative of the level of ordinary skill in the art to which this invention pertains. All publications and patent applications are herein incorporated by reference to the same extent as if each individual publication or patent application was specifically and individually indicated by reference.

Aspects have been described with reference to various specific and preferred embodiments and techniques. However, it should be understood that many variations and modifications may be made while remaining within the spirit and scope herein.

The invention claimed is:

1. A display enclosure device comprising:
   a housing enclosing an interior volume, the housing comprising
     a front panel, the front panel defining an aperture;
   a translucent pane of material occluding the aperture in the front panel;
   an air intake vent disposed on the housing adjacent the bottom of the housing;
   a first fan in fluid communication with the air intake vent to move air from the air intake vent and into the enclosed interior volume;
   an air exhaust turret disposed on top of the housing and in fluid communication with the interior volume of the housing;
   the air exhaust turret comprising an air exhaust vent to convey air from inside the air exhaust turret to exterior environment;
   wherein the housing defines a first upward airflow path at front of the housing corresponding to a space between the translucent pane of material and front side of a monitor when mounted inside the interior volume and a second upward airflow path at middle and/or back of the housing corresponding to a space between back side of the monitor when mounted inside the interior volume and the back of the housing, and wherein the first upward airflow path is isolated from the second upward airflow path from the inlet of each airflow path to the air exhaust turret.

2. The display enclosure device of claim 1, further comprising a filter in fluid communication with the air intake vent.

3. The display enclosure device of claim 1, further comprising an airflow valve in fluid communication with the air exhaust vent, the airflow valve configured to open when air pressure inside the air exhaust turret exceeds air pressure in the exterior environment.

4. The display enclosure device of claim 1, the air exhaust turret comprising an overhanging edge portion, the overhanging edge portion separated from the top surface of the housing by an air gap.

5. The display enclosure device of claim 1, the air exhaust vent disposed on bottom of the overhanging edge portion.

6. The display enclosure device of claim 5, the air exhaust turret comprising multiple sides, the air exhaust vent allowing air to flow out of the air exhaust turret on more than one side.

7. The display enclosure device of claim 1, direction of airflow through the air exhaust turret changing from upward to downward.

8. The display enclosure device of claim 1, the air exhaust turret comprising a shape selected from polygonal, rectangular, square, non-polygonal, oval, and circular.

9. The display enclosure device of claim 1, the air exhaust turret comprising a waterproof top surface.

10. The display enclosure device of claim 1, further comprising a hinge coupling the front panel to the housing allowing bottom portion of the front panel to swing outward from the bottom portion of the housing.

11. The display enclosure device of claim 1, further comprising airflow baffles disposed within the housing to at least partially define the first upward airflow path and the second upward airflow path.

12. The display enclosure device of claim 1, the air intake vent comprising a mesh material through which incoming air flows.

13. The display enclosure device of claim 1, the air intake vent comprising louvers to selectively close off passage of air through the air intake vent.

14. The display enclosure device of claim 13, further comprising an actuator coupled to the louvers to open and close the louvers.

15. The display enclosure device of claim 1, a recirculation fan to recirculate air through the interior volume.

16. The display enclosure device of claim 15, further comprising electric heating elements.

17. The display enclosure device of claim 1, a monitor support bracket disposed within the housing; the support bracket comprising several long articulated sections to hold a display monitor.

18. The display enclosure device of claim 17, the support bracket configured to swivel bottom portion of the display monitor outward.

19. The display enclosure device of claim 1, a temperature sensor disposed within the housing and a control unit in electronic communication with the temperature sensor; the control unit configured to control operation of the first fan.

20. The display enclosure device of claim 19, wherein the control unit initiates movement of the first fan when temperature sensor indicates that temperature has risen above a threshold temperature.

21. The display enclosure device of claim 19, wherein the control unit sets speed of the first fan proportionately to difference between a threshold temperature and current temperature indicated by the temperature sensor.

22. The display enclosure device of claim 1, a second fan in fluid communication with the enclosed interior volume and the air exhaust vent.

23. The display enclosure device of claim 2, the filter comprising a filter medium to remove particulate material from air passing through the filter.

24. The display enclosure device of claim 23, the filter medium comprising a reticulated cellulose material.

25. The display enclosure device of claim 1, the housing further comprising:
   a back panel opposite the front panel;
   a first side panel;
   a second side panel opposite the first side panel;
   a top panel having a water-tight top surface; and
   a bottom panel.

26. The display enclosure device of claim 25, the housing further comprising an internal frame to which the panels are attached.

27. The display enclosure device of claim 25, wherein distance between the front panel and the back panel is less than half of distance between the first side panel and the second side panel.

28. The display enclosure device of claim 1, a display monitor disposed within the housing aligned with the aperture in the front panel, the display monitor selected from the group consisting of LED, OLED, LCD, or other flat or curved panel display monitors.

29. A modular display enclosure device comprising:
   at least two housing modules each enclosing an interior volume, the housing modules each comprising
      a front panel, the front panel defining an aperture;
   at least two translucent panes of material occluding the apertures in the front panels;
   at least two air intake vents disposed on the housing modules adjacent the bottom of the housing modules;
   at least two filters in fluid communication with the air intake vents;
   at least two first fans in fluid communication with the air intake vents to move air from the air intake vents, through the filters, and into the enclosed interior volumes;
   at least two air exhaust turrets disposed on top of the housing modules and in fluid communication with the interior volumes of the housing modules;
   the air exhaust turrets comprising air exhaust vents to convey air from inside the air exhaust turrets to exterior environment;
   wherein each of the housing modules defines a first upward airflow path at front of the housing module corresponding to a space between the translucent pane of material and front side of a monitor when mounted inside the interior volume and a second upward airflow path at middle and/or back of the housing module corresponding to a space between back side of the monitor when mounted inside the interior volume and the back of the housing module, and wherein the first upward airflow path is isolated from the second upward airflow path from the inlet of each airflow path to the air exhaust turret.

\* \* \* \* \*